(12) United States Patent
Blanchard (10) Patent No.: US 7,535,041 B2
(45) Date of Patent: May 19, 2009

(54) METHOD FOR MAKING A SEMICONDUCTOR DEVICE INCLUDING REGIONS OF BAND-ENGINEERED SEMICONDUCTOR SUPERLATTICE TO REDUCE DEVICE-ON RESISTANCE

(75) Inventor: Richard A. Blanchard, Los Altos, CA (US)

(73) Assignee: Mears Technologies, Inc., Waltham, MA (US)

( * ) Notice: Subject to any disclaimer, the term of this patent is extended or adjusted under 35 U.S.C. 154(b) by 51 days.

(21) Appl. No.: 11/534,343

(22) Filed: Sep. 22, 2006

(65) Prior Publication Data
US 2007/0012999 A1    Jan. 18, 2007

Related U.S. Application Data

(63) Continuation-in-part of application No. 10/940,426, filed on Sep. 14, 2004, now Pat. No. 7,436,026, which is a continuation of application No. 10/647,069, filed on Aug. 22, 2003, now Pat. No. 6,897,472, which is a continuation-in-part of application No. 10/603,696, filed on Jun. 26, 2003, now abandoned, and a continuation-in-part of application No. 10/603,621, filed on Jun. 26, 2003, now abandoned.

(60) Provisional application No. 60/720,302, filed on Sep. 23, 2005.

(51) Int. Cl.
*H01L 21/338*    (2006.01)
(52) U.S. Cl. .................. 257/285; 257/197
(58) Field of Classification Search ............ 257/197, 257/285
See application file for complete search history.

(56) References Cited

U.S. PATENT DOCUMENTS

| 4,205,331 | A | 5/1980 | Esaki et al. | 357/30 |
| 4,370,510 | A | 1/1983 | Stirn | 136/262 |
| 4,485,128 | A | 11/1984 | Dalal et al. | 427/85 |
| 4,594,603 | A | 6/1986 | Holonyak, Jr. | 357/16 |

(Continued)

FOREIGN PATENT DOCUMENTS

EP     0 843 361     5/1998

(Continued)

OTHER PUBLICATIONS

Luo et al., *Chemical Design of Direct-Gap Light-Emitting Silicon*, published Jul. 25, 2002, The American Physical Society; vol. 89, No. 7.

(Continued)

*Primary Examiner*—Long Pham
(74) *Attorney, Agent, or Firm*—Allen, Dyer, Doppelt, Milbrath & Gilchrist, PA (57) ABSTRACT

A method for making a semiconductor device which may include providing a substrate having a plurality of spaced apart superlattices therein, and forming source and drain regions in the substrate defining a channel region therebetween and with the plurality of spaced apart superlattices in the channel and/or drain regions. Each superlattice may include a plurality of stacked groups of layers, with each group including a plurality of stacked base semiconductor monolayers defining a base semiconductor portion and at least one non-semiconductor monolayer thereon. Moreover, the at least one non-semiconductor monolayer may be constrained within a crystal lattice of adjacent base semiconductor portions.

25 Claims, 12 Drawing Sheets

U.S. PATENT DOCUMENTS

| | | | | |
|---|---|---|---|---|
| 4,882,609 | A | | 11/1989 | Schubert et al. ............... 357/22 |
| 4,908,678 | A | * | 3/1990 | Yamazaki ................... 257/20 |
| 4,937,204 | A | | 6/1990 | Ishibashi et al. ............ 437/110 |
| 4,969,031 | A | | 11/1990 | Kobayashi et al. ............ 357/63 |
| 5,055,887 | A | | 10/1991 | Yamazaki ..................... 357/4 |
| 5,081,513 | A | | 1/1992 | Jackson et al. ............. 357/23.7 |
| 5,216,262 | A | * | 6/1993 | Tsu ............................ 257/17 |
| 5,357,119 | A | | 10/1994 | Wang et al. ................... 257/18 |
| 5,577,061 | A | | 11/1996 | Hasenberg et al. ............ 372/45 |
| 5,594,567 | A | | 1/1997 | Akiyama et al. .............. 349/28 |
| 5,606,177 | A | | 2/1997 | Wallace et al. ................ 257/25 |
| 5,616,515 | A | | 4/1997 | Okuno ....................... 438/478 |
| 5,627,386 | A | | 5/1997 | Harvey et al. ................ 257/79 |
| 5,683,934 | A | | 11/1997 | Candelaria ................. 437/134 |
| 5,684,817 | A | | 11/1997 | Houdre et al. ................ 372/45 |
| 5,994,164 | A | | 11/1999 | Fonash et al. ................ 438/97 |
| 6,058,127 | A | | 5/2000 | Joannopoulos et al. ........ 372/92 |
| 6,255,150 | B1 | | 7/2001 | Wilk et al. .................. 438/191 |
| 6,274,007 | B1 | | 8/2001 | Smirnov et al. ............. 204/192 |
| 6,281,518 | B1 | | 8/2001 | Sato ........................... 257/13 |
| 6,281,532 | B1 | | 8/2001 | Doyle et al. ................ 257/288 |
| 6,326,311 | B1 | | 12/2001 | Ueda et al. .................. 438/694 |
| 6,344,271 | B1 | | 2/2002 | Yadav et al. ............... 428/402 |
| 6,350,993 | B1 | | 2/2002 | Chu et al. .................... 257/19 |
| 6,376,337 | B1 | | 4/2002 | Wang et al. ................ 438/478 |
| 6,436,784 | B1 | | 8/2002 | Allam ........................ 438/380 |
| 6,472,685 | B2 | | 10/2002 | Takagi ......................... 257/77 |
| 6,498,359 | B2 | | 12/2002 | Schmidt et al. ............. 257/190 |
| 6,501,092 | B1 | | 12/2002 | Nikonov et al. .............. 257/29 |
| 6,521,549 | B1 | | 2/2003 | Kamath et al. ............. 438/786 |
| 6,566,679 | B2 | | 5/2003 | Nikonov et al. .............. 257/29 |
| 6,608,327 | B1 | | 8/2003 | Davis et al. .................. 257/76 |
| 6,621,097 | B2 | | 9/2003 | Nikonov et al. .............. 257/17 |
| 6,638,838 | B1 | | 10/2003 | Eisenbeiser et al. ......... 438/481 |
| 6,646,293 | B2 | | 11/2003 | Emrick et al. ............... 257/194 |
| 6,673,646 | B2 | | 1/2004 | Droopad ...................... 438/85 |
| 6,690,699 | B2 | | 2/2004 | Capasso et al. ............... 372/44 |
| 6,711,191 | B1 | | 3/2004 | Kozaki et al. ................ 372/43 |
| 6,748,002 | B2 | | 6/2004 | Shveykin .................... 372/45 |
| 6,816,530 | B2 | | 11/2004 | Capasso et al. ............... 372/50 |
| 6,891,869 | B2 | | 5/2005 | Augusto ...................... 372/43 |
| 2002/0094003 | A1 | | 7/2002 | Bour et al. .................... 372/46 |
| 2003/0034529 | A1 | | 2/2003 | Fitzgerald et al. ........... 257/369 |
| 2003/0057416 | A1 | | 3/2003 | Currie et al. ................... 257/19 |
| 2003/0089899 | A1 | | 5/2003 | Lieber et al. .................... 257/9 |
| 2003/0162335 | A1 | | 8/2003 | Yuki et al. .................. 438/151 |
| 2003/0215990 | A1 | | 11/2003 | Fitzgerald et al. ........... 438/172 |
| 2004/0084781 | A1 | | 5/2004 | Ahn et al. .................... 257/777 |
| 2004/0227165 | A1 | | 11/2004 | Wang et al. ................. 257/222 |
| 2005/0031247 | A1 | | 2/2005 | Mears et al. .................. 385/14 |

FOREIGN PATENT DOCUMENTS

| | | |
|---|---|---|
| GB | 2347520 | 9/2000 |
| JP | 61027681 | 2/1986 |
| JP | 61145820 | 7/1986 |
| JP | 61220339 | 9/1986 |
| JP | 62219665 | 9/1987 |
| WO | 99/63580 | 12/1999 |
| WO | 02/103767 | 12/2002 |
| WO | 2005/034245 | 4/2005 |

OTHER PUBLICATIONS

Tsu, *Phenomena in Silicon Nanostructure Devices*, University of North Carolina at Charlotte, Sep. 6, 2000.

Ye et al., *GaAs MOSFET with Oxide Gate Dielectric Grown by Atomic Layer Deposition*, Agere Systems, Mar. 2003.

Novikov et al., *Silicon-based Optoelectronics*, 1999-2003, pp. 1-6.

Fan et al., *N- and P-Type SiGe/Si Superlattice Coolers*, the Seventeenth Intersociety Conference on Thermomechanical Phenomena in Electronic Systems (ITherm 2000), vol. 1, pp. 304-307, Las Vegas, NV, May 2000.

Shah et al., *Experimental Analysis and Theoretical Model for Anomalously High Ideality Factors (n>2.0) in AlGaN/GaN P-N Junction Diodes*, Journal of Applied Physics, vol. 94, No. 4, Aug. 15, 2003.

Ball, *Striped Nanowires Shrink Electronics*, news@nature.com, Feb. 7, 2002.

Fiory et al., *Light Emission from Silicon: Some Perspectives and Applications*, Journal of Electronic Materials, vol. 32, No. 10, 2003.

*Lecture 6: Light Emitting and Detecting Devices*, MSE 6001, Semiconductor Materials Lectures, Fall 2004.

Harvard University Professor and Nanosys Co-Founder, Charlie Lieber, *Raises the Stakes in the Development of Nanoscale Superlattice Structures and Nanodevices*, Feb. 8, 2002, Nanosys, Inc.

Burgess, *Electronics Integrated with Photonics in 3-D in Silicon Chip*, Photonics Spectra, Jan. 2006.

* cited by examiner

METHOD FOR MAKING A SEMICONDUCTOR DEVICE INCLUDING REGIONS OF BAND-ENGINEERED SEMICONDUCTOR SUPERLATTICE TO REDUCE DEVICE-ON RESISTANCE

CROSS-REFERENCE TO RELATED APPLICATIONS

This application claims the benefit of U.S. Provisional Application No. 60/720,302, filed Sep. 23, 2005, and is a continuation-in-part of U.S. patent application Ser. No. 10/940,426 filed Sep. 14, 2004 now U. S. Pat. No. 7,436,026, which is a continuation of U.S. patent application Ser. No. 10/647,069 filed Aug. 22, 2003, now U.S. Pat. No. 6,897,472, which is a continuation-in-part of U.S. patent application Ser. Nos. 10/603,696 and 10/603,621 filed on Jun. 26, 2003 now abandoned, the entire disclosures of which are incorporated by reference herein.

FIELD OF THE INVENTION

The present invention relates to the field of semiconductors, and, more particularly, to semiconductors having enhanced properties based upon energy band engineering and associated methods.

BACKGROUND OF THE INVENTION

Structures and techniques have been proposed to enhance the performance of semiconductor devices, such as by enhancing the mobility of the charge carriers. For example, U.S. Patent Application No. 2003/0057416 to Currie et al. discloses strained material layers of silicon, silicon-germanium, and relaxed silicon and also including impurity-free zones that would otherwise cause performance degradation. The resulting biaxial strain in the upper silicon layer alters the carrier mobilities enabling higher speed and/or lower power devices. Published U.S. Patent Application No. 2003/0034529 to Fitzgerald et al. discloses a CMOS inverter also based upon similar strained silicon technology.

U.S. Pat. No. 6,472,685 B2 to Takagi discloses a semiconductor device including a silicon and carbon layer sandwiched between silicon layers so that the conduction band and valence band of the second silicon layer receive a tensile strain. Electrons having a smaller effective mass, and which have been induced by an electric field applied to the gate electrode, are confined in the second silicon layer, thus, an n-channel MOSFET is asserted to have a higher mobility.

U.S. Pat. No. 4,937,204 to Ishibashi et al. discloses a superlattice in which a plurality of layers, less than eight monolayers, and containing a fractional or binary or a binary compound semiconductor layer, are alternately and epitaxially grown. The direction of main current flow is perpendicular to the layers of the superlattice.

U.S. Pat. No. 5,357,119 to Wang et al. discloses a Si—Ge short period superlattice with higher mobility achieved by reducing alloy scattering in the superlattice. Along these lines, U.S. Pat. No. 5,683,934 to Candelaria discloses an enhanced mobility MOSFET including a channel layer comprising an alloy of silicon and a second material substitutionally present in the silicon lattice at a percentage that places the channel layer under tensile stress.

U.S. Pat. No. 5,216,262 to Tsu discloses a quantum well structure comprising two barrier regions and a thin epitaxially grown semiconductor layer sandwiched between the barriers. Each barrier region consists of alternate layers of SiO2/Si with a thickness generally in a range of two to six monolayers. A much thicker section of silicon is sandwiched between the barriers.

An article entitled "Phenomena in silicon nanostructure devices" also to Tsu and published online Sep. 6, 2000 by Applied Physics and Materials Science & Processing, pp. 391-402 discloses a semiconductor-atomic superlattice (SAS) of silicon and oxygen. The Si/O superlattice is disclosed as useful in a silicon quantum and light-emitting devices. In particular, a green electromuminescence diode structure was constructed and tested. Current flow in the diode structure is vertical, that is, perpendicular to the layers of the SAS. The disclosed SAS may include semiconductor layers separated by adsorbed species such as oxygen atoms, and CO molecules. The silicon growth beyond the adsorbed monolayer of oxygen is described as epitaxial with a fairly low defect density. One SAS structure included a 1.1 nm thick silicon portion that is about eight atomic layers of silicon, and another structure had twice this thickness of silicon. An article to Luo et al. entitled "Chemical Design of Direct-Gap Light-Emitting Silicon" published in Physical Review Letters, Vol. 89, No. 7 (Aug. 12, 2002) further discusses the light emitting SAS structures of Tsu.

Published International Application WO 02/103,767 A1 to Wang, Tsu and Lofgren, discloses a barrier building block of thin silicon and oxygen, carbon, nitrogen, phosphorus, antimony, arsenic or hydrogen to thereby reduce current flowing vertically through the lattice more than four orders of magnitude The insulating layer/barrier layer allows for low defect epitaxial silicon to be deposited next to the insulating layer.

Published Great Britain Patent Application 2,347,520 to Mears et al. discloses that principles of Aperiodic Photonic Band-Gap (APBG) structures may be adapted for electronic bandgap engineering. In particular, the application discloses that material parameters, for example, the location of band minima, effective mass, etc., can be tailored to yield new aperiodic materials with desirable band-structure characteristics. Other parameters, such as electrical conductivity, thermal conductivity and dielectric permittivity or magnetic permeability are disclosed as also possible to be designed into the material.

The resistance to carrier flow in semiconductor devices is a significant source of inefficiency, particularly in majority carrier devices such as metal-oxide semiconductor field-effect transistors (MOSFETs). Accordingly, it would be desirable to provide enhanced semiconductor materials that could reduce carrier flow on-resistance in such devices.

SUMMARY OF THE INVENTION

In view of the foregoing background, it is therefore an object of the present invention to provide a semiconductor device with reduced carrier flow on-resistance.

This and other objects, features, and advantages in accordance with the invention are provided by a method for making a semiconductor device which may include providing a substrate having a plurality of spaced apart superlattices therein, and forming source and drain regions in the substrate defining a channel region therebetween and with the plurality of spaced apart superlattices in the channel and/or drain regions Each superlattice may include a plurality of stacked groups of layers, with each group including a plurality of stacked base semiconductor monolayers defining a base semiconductor portion and at least one non-semiconductor monolayer thereon. Moreover, the at least one non-semiconductor monolayer may be constrained within a crystal lattice of adjacent base semiconductor portions More particularly, the source and drain regions may be laterally spaced apart, and the spaced apart superlattices may extend laterally between the source and drain regions. Additionally, the source and drain regions may be vertically spaced apart, and the spaced apart superlattices may extend vertically between the source and drain regions. Furthermore, the spaced apart superlattices may be substantially parallel to one another. The method may further include forming a gate dielectric layer adjacent the channel region, and forming a gate electrode layer adjacent the gate dielectric layer.

By way of example, the base semiconductor portions may include silicon, and the non-semiconductor monolayers may include oxygen More generally, the base semiconductor portions may include a base semiconductor selected from the group consisting of Group IV semiconductors, Group III-V semiconductors, and Group II-VI semiconductors, and the non-semiconductor monolayers may include a non-semiconductor selected from the group consisting of oxygen, nitrogen, fluorine, and carbon-oxygen.

Each non-semiconductor layer may be a single monolayer thick, for example. Moreover, each base semiconductor portion may be less than eight monolayers thick. Also, each superlattice may further include a base semiconductor cap layer on an uppermost group of layers. In addition, all of the base semiconductor portions may be a same number of monolayers thick, at least some of the base semiconductor portions may be a different number of monolayers thick, or all of the base semiconductor portions may be a different number of monolayers thick Furthermore, opposing base semiconductor portions in adjacent groups of layers of each superlattice may be chemically bound together.

DETAILED DESCRIPTION OF THE INVENTION

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime notation is used to indicate similar elements in alternative embodiments.

The present invention relates to controlling the properties of semiconductor materials at the atomic or molecular level to achieve improved performance within semiconductor devices. Further, the invention relates to the identification, creation, and use of improved materials for use in semiconductor devices. In particular, the following description discusses the incorporation of trenches that have been filled with high carrier mobility, band-engineered semiconductor superlattice structures to advantageously reduce device on-resistance.

Applicants theorize, without wishing to be bound thereto, that certain superlattices as described herein reduce the effective mass of charge carriers and that this thereby leads to higher charge carrier mobility. Effective mass is described with various definitions in the literature. As a measure of the improvement in effective mass Applicants use a "conductivity reciprocal effective mass tensor", $M_e^{-1}$ and $M_h^{-1}$ for electrons and holes respectively, defined as:

$$M_{e,ij}^{-1}(E_F, T) = \frac{\sum_{E>E_F} \int_{B.Z.} (\nabla_k E(k, n))_i (\nabla_k E(k, n))_j \frac{\partial f(E(k, n), E_F, T)}{\partial E} d^3k}{\sum_{E>E_F} \int_{BZ} f(E(k, n), E_F, T) d^3k}$$

for electrons and:

$$M_{h,ij}^{-1}(E_F, T) = \frac{-\sum_{E<E_F} \int_{B.Z.} (\nabla_k E(k, n))_i (\nabla_k E(k, n))_j \frac{\partial f(E(k, n), E_F, T)}{\partial E} d^3k}{\sum_{E<E_F} \int_{BZ} (1 - f(E(k, n), E_F, T)) d^3k}$$

for holes, where f is the Fermi-Dirac distribution, $E_F$ is the Fermi energy, T is the temperature, E(k,n) is the energy of an electron in the state corresponding to wave vector k and the $n^{th}$ energy band, the indices i and j refer to Cartesian coordinates x, y and z, the integrals are taken over the Brillouin zone (B.Z.), and the summations are taken over bands with energies above and below the Fermi energy for electrons and holes respectively.

Applicants' definition of the conductivity reciprocal effective mass tensor is such that a tensorial component of the conductivity of the material is greater for greater values of the corresponding component of the conductivity reciprocal effective mass tensor. Again Applicants theorize without wishing to be bound thereto that the superlattices described herein set the values of the conductivity reciprocal effective mass tensor so as to enhance the conductive properties of the material, such as typically for a preferred direction of charge carrier transport. The inverse of the appropriate tensor element is referred to as the conductivity effective mass. In other words, to characterize semiconductor material structures, the conductivity effective mass for conduction electrons and holes as described above and calculated in the direction of intended carrier transport is used to distinguish improved materials.

Figure 1:
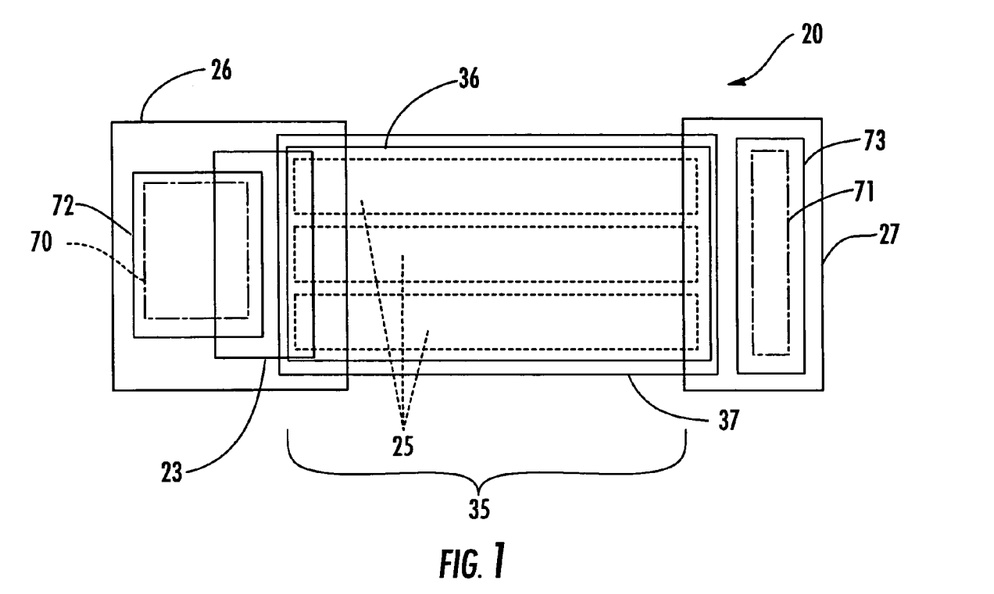
FIG. 1 is a top view of a n-channel lateral DMOS device in accordance with the invention including a plurality of superlattices in the drain and channel regions thereof.
Figure 2:
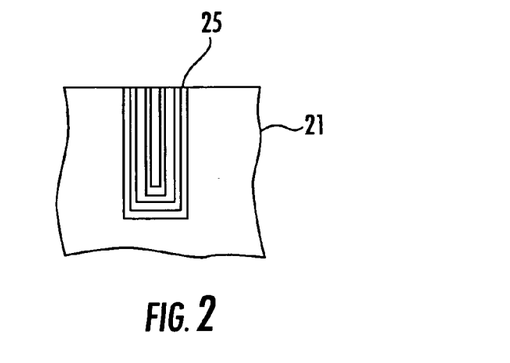
FIG. 2 is a cross-sectional view of a superlattice of the device of FIG. 1.
Figure 3:
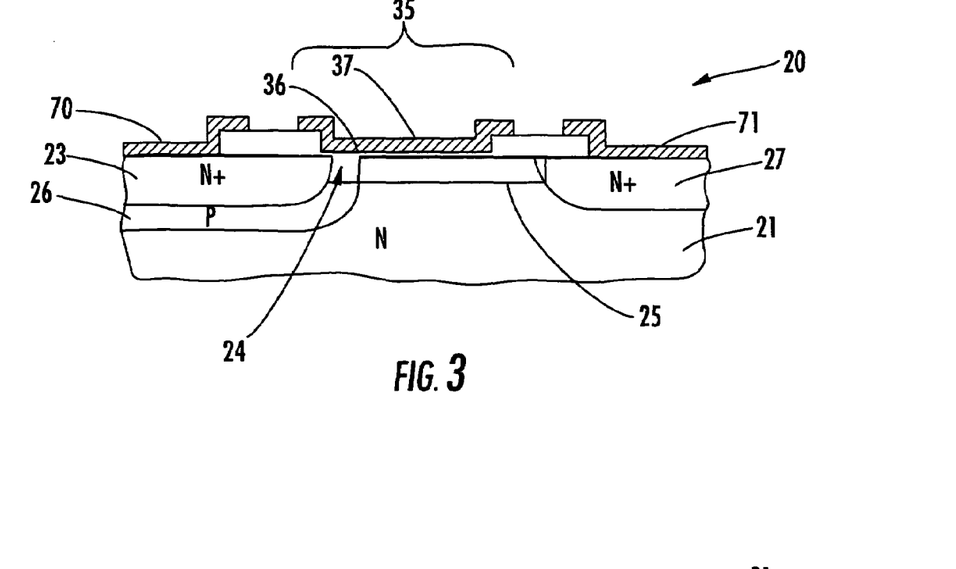
FIG. 3 is a cross-sectional view of the device of FIG. 1 taken along line 3-3.
Figure 4:
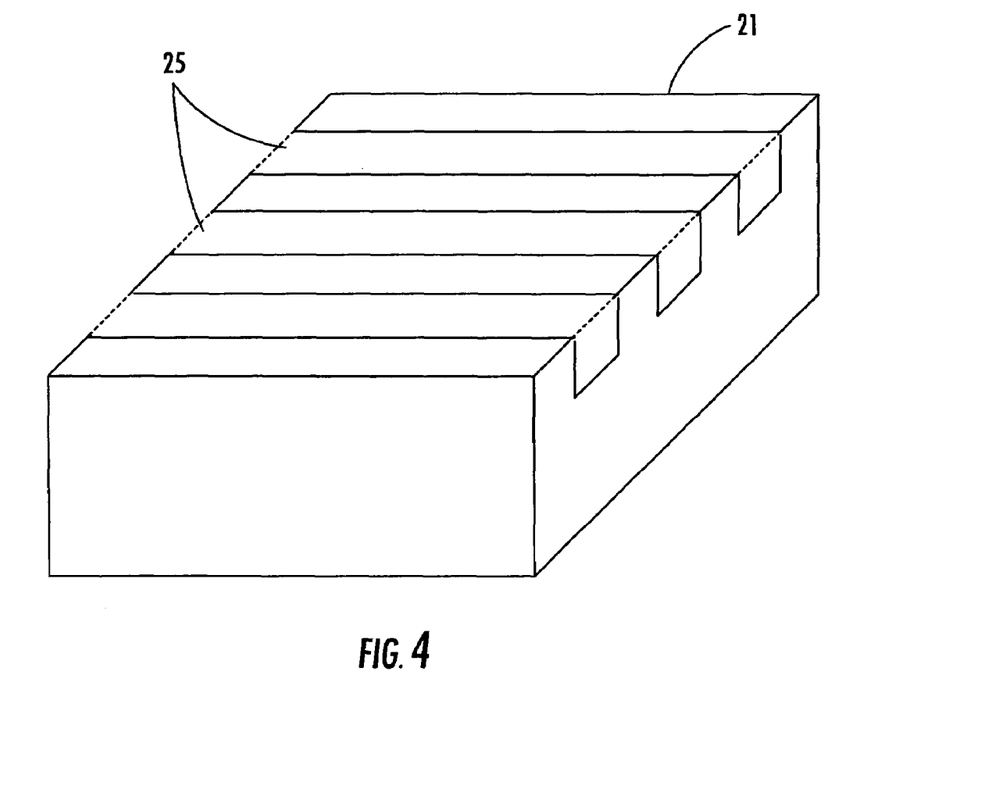
FIG. 4 is a perspective view of the substrate of the device of FIG. 1 illustrating the superlattice filled trenches therein.
Figure 13:
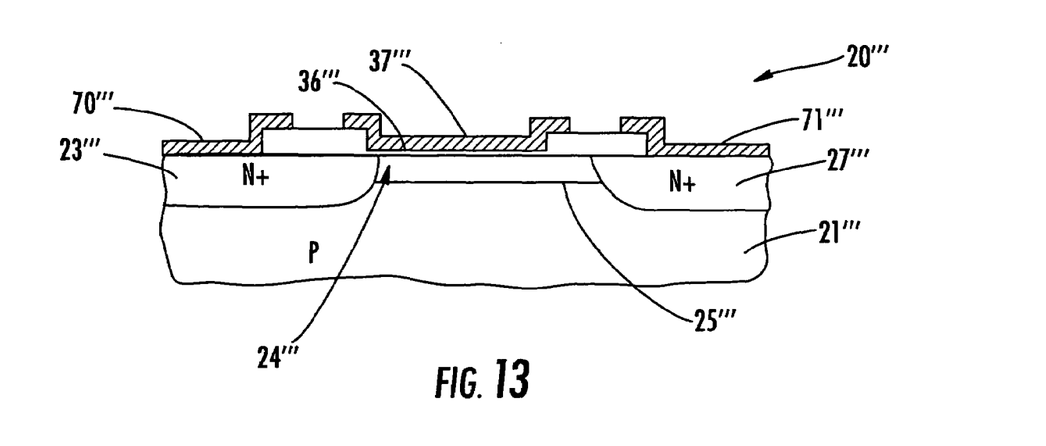
FIG. 13 is a cross-sectional view of an n-channel MOSFET device in accordance with the invention including a plurality of superlattices for reducing on-resistance.

Using the above-described measures, one can select materials having improved band structures for specific purposes. One such example would be a superlattice 25 material (which will be discussed in further detail below) used in a metal-oxide semiconductor field-effect transistor (MOSFET), such as a lateral DMOS device 20 shown in FIGS. 1-4. While a lateral DMOS structure is shown and described herein for exemplary purposes, it will be appreciated that the superlattice material may also be similarly incorporated in other semiconductor devices (e.g., PMOS, NMOS, CMOS, etc.), as shown in FIG. 13. The device 20 illustratively includes a substrate 21, a source region 23, a body region 26, and a doped drain region 27. The source and drain regions 23 and 27 define a channel region 24 therebetween. The source and drain regions 23, 27 have respective contacts 70, 71 and metalizations 72, 73 thereon (FIG. 1). It will be understood that in FIG. 1 carrier flow would be from left to right. It should be noted that the drain of the illustrated device includes not only the doped drain region 27 (which is where an ohmic contact is made), but also portions of the N-type region to the right of, and below the P-type body 26.

The device 20 also illustratively includes a plurality of spaced apart superlattices 25, which in the present example extend into the channel and drain regions 24, 27. The superlattices 25 illustratively extend laterally between the source and drain regions 23, 27. In the case of a lateral DMOS device, the superlattices 25 may only be in the drain region 27 in some embodiments and only in the channel region in other embodiments, but in the illustrated embodiment the superlattices 25 are present in both the channel region 24 and the drain region 27.

A gate structure 35 is formed on the substrate 21 and illustratively includes a gate dielectric layer 36 overlying the channel region 24, and a gate electrode layer 37 overlying the gate dielectric layer. As will be appreciated from the description of the superlattice structures below, inclusion of the spaced-apart superlattices in the channel and/or drain regions 24, 27 of the device 20 may advantageously decrease on-resistance in the primary carrier flow path, which in the illustrated example is lateral and along the surface of the substrate 21, since this is a lateral DMOSFET device. Also, in the illustrated example, the spaced apart superlattices 25 are substantially parallel to one another, although other configurations may be used in other embodiments.

Figure 5:
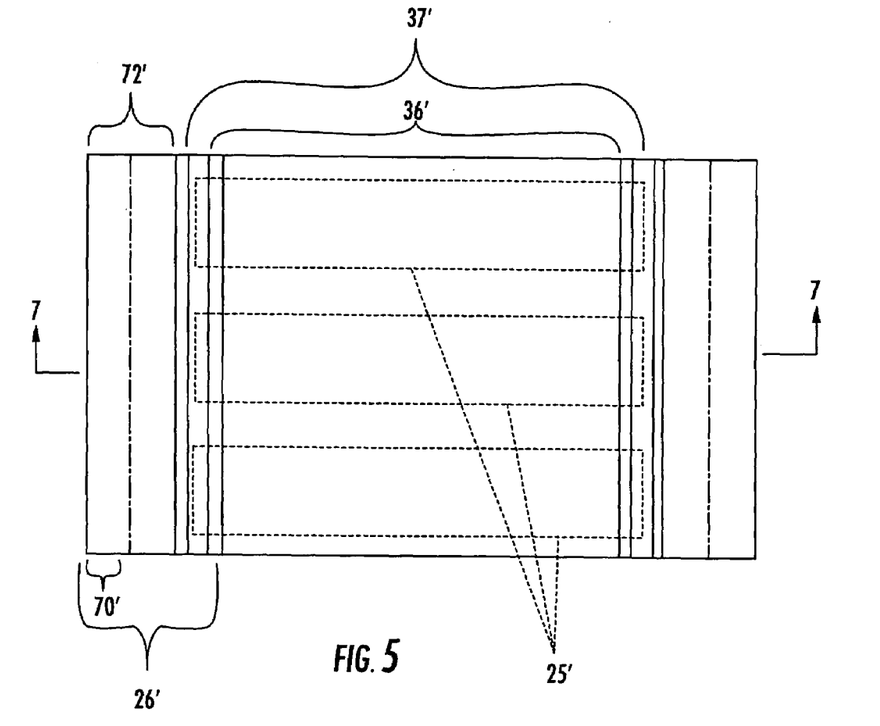
FIG. 5 is a top view of a n-channel vertical DMOS device in accordance with the invention including a plurality of superlattices in the drain and channel regions thereof.
Figure 6:
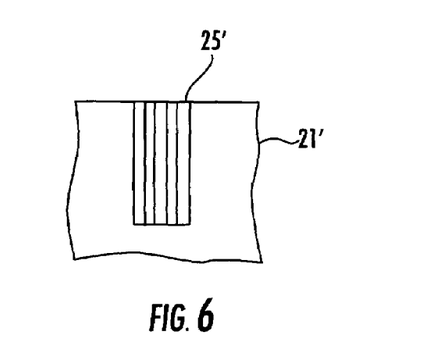
FIG. 6 is a cross-sectional view of a superlattice of the device of FIG. 5.
Figure 7:
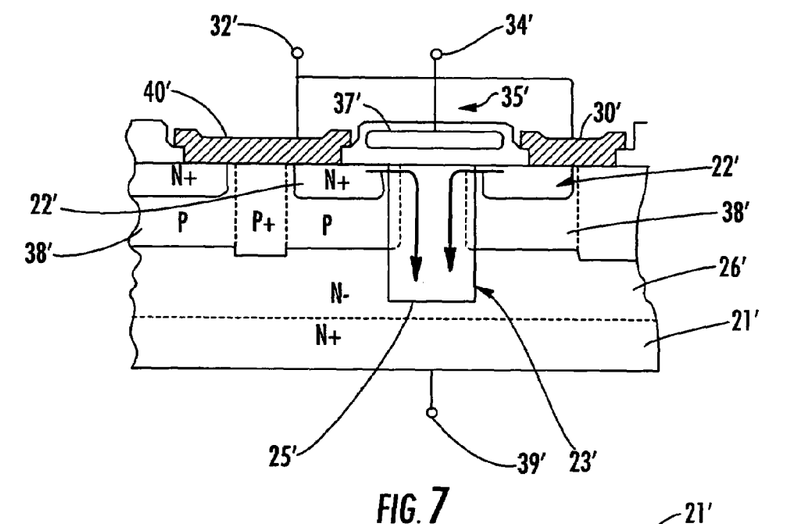
FIG. 7 is a cross-sectional view of the device of FIG. 5 taken along line 7-7.
Figure 8:
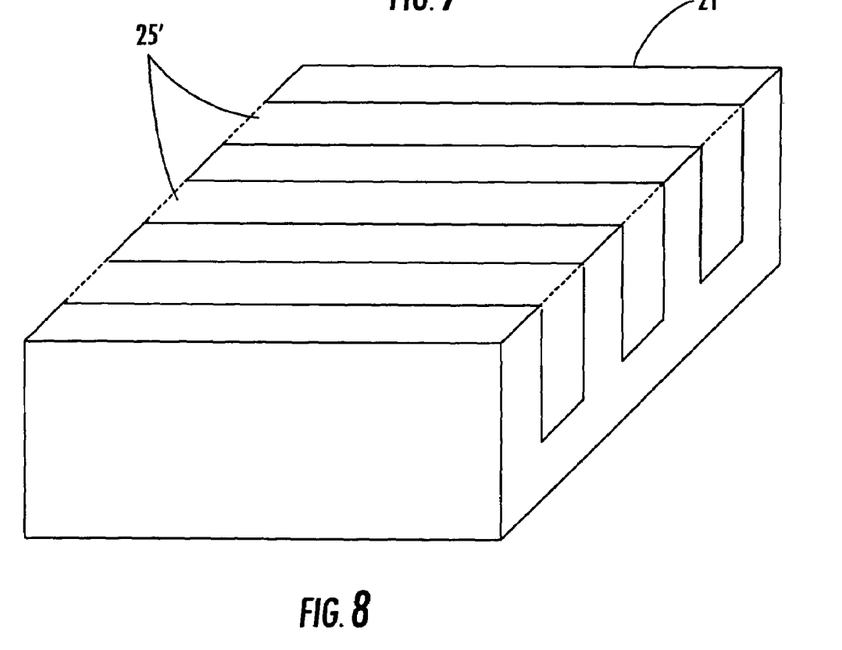
FIG. 8 is a perspective view of the substrate of the device of FIG. 5 illustrating the superlattice-filled trenches therein.

Turning now to FIGS. 5-8, another exemplary embodiment of a vertical DMOS device 20' is now described. In this embodiment, the source and drain regions 22', 23' both laterally are vertically spaced apart, i.e., the drain region is beside and below the source region with a body region 38' positioned therebetween, and the superlattices 25' extend vertically between the source and drain regions as seen in FIGS. 6 and 7. The body regions 38' are formed in an N-epitaxial layer 26' formed on N+ substrate 21'. The device 20' further illustratively includes metal contacts 30', 40' adjacent to the gate 35', a source/body terminal 32', a gate terminal 34', and a drain terminal 39'.

Figure 14:
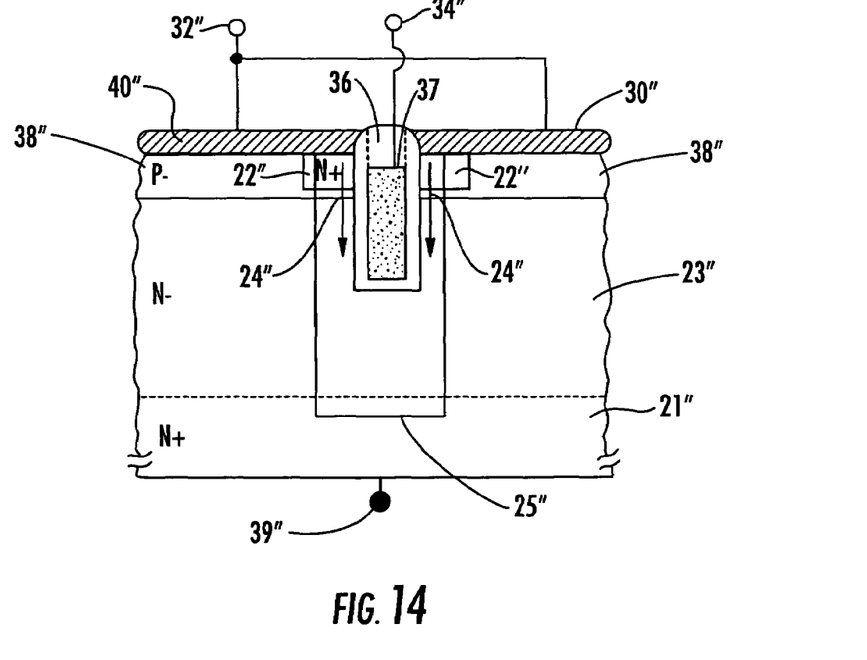
FIG. 14 is a cross-section view of an n-channel trench DMOS device in accordance with the invention including a plurality of superlattices for reducing on-resistance.
Figure 15:
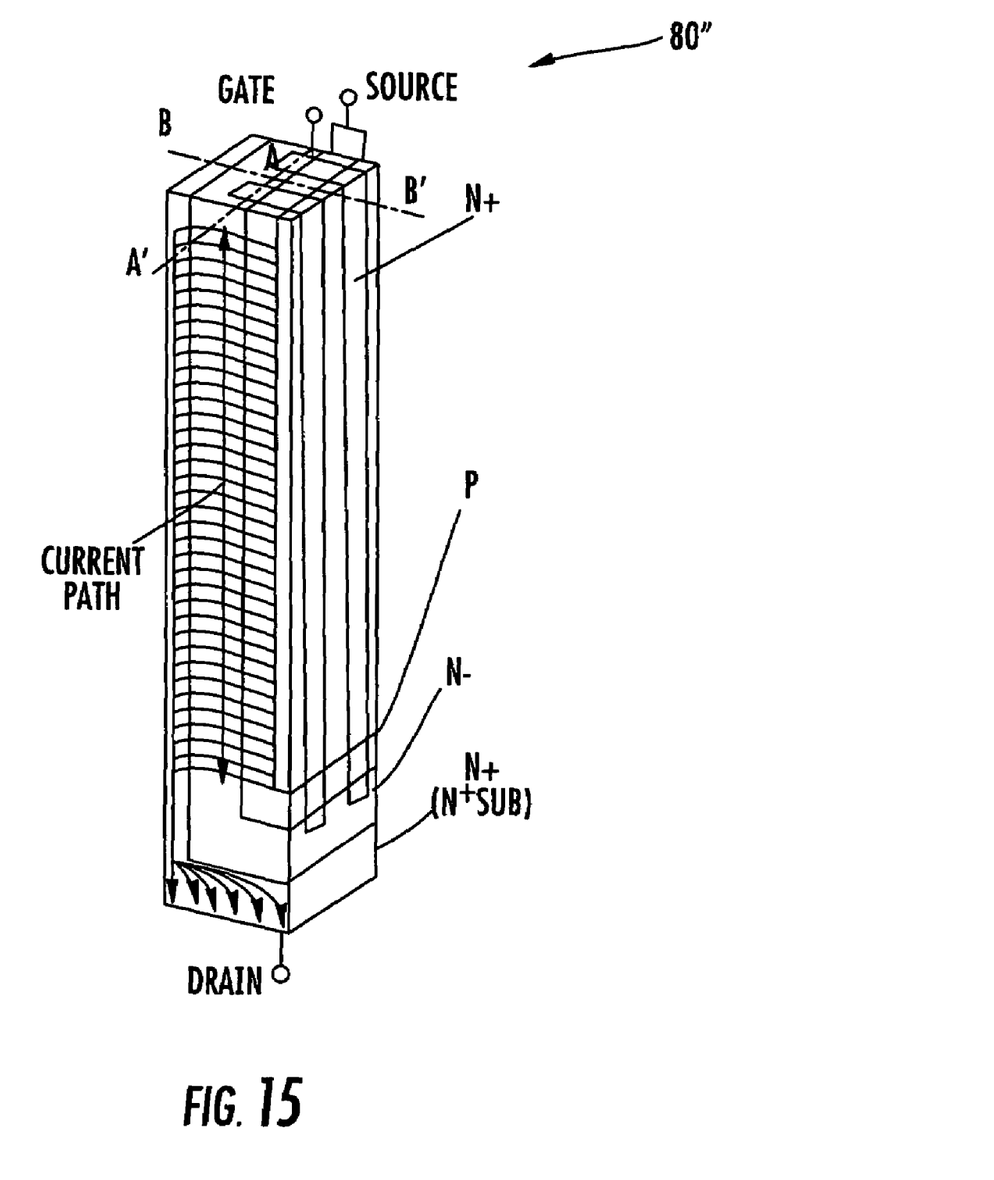
FIG. 15 is a perspective view of an n-channel super 3D MOSFET in which a plurality of superlattices may be used for reducing on-resistance in accordance with the invention.

Here again, it should be noted that other device configurations are possible, such as a conventional MOS device as shown in FIG. 13 and a trench DMOS device 20" shown in FIG. 14. Further details on trench DMOS devices may be found in U.S. Pat. No. 4,767,722 to Blanchard, which is hereby incorporated herein in its entirety by reference. Another exemplary structure in which the above-described superlattice-filled trenches may advantageously be used to reduce device on-resistance is a super 3D MOSFET 80" as shown in FIG. 15 and further described in an article by J. Sakakibara entitled "Break-Through Of The Si Limit Under 300 V Breakdown Voltage With New Concept Power Device: Super 3D MOSFET," 2002 IEEE, Super 3D MOSFET, Proc. ISPSD, pgs. 233-236, which is also incorporated herein in its entirety by reference.

While all of the devices in the figures are n-channel devices, p-channel devices may be formed by substituting n-type regions for p-type regions and visa-versa.

The superlattices 25 may be formed using various techniques. One approach is to etch trenches in the substrate 21, and then perform selective atomic layer deposition on the sidewalls and bottoms of the trenches (FIG. 2), or just the sidewalls of the trenches (FIG. 6) to form superlattice structures as described below, as will be appreciated by those skilled in the art. The trenches may extend just between the source and drain regions as shown in FIG. 1 and just between the source regions as shown in FIG. 5, or may extend across the entire device or across the entire wafer. Alternatively, superlattice 25 pillars may be formed on the surface of a semiconductor layer, and then semiconductor material may be deposited (e.g., epitaxially) or built-up on the semiconductor layer around the pillars and optionally polished to thereby define the substrate 21 with superlattices 25 therein. Further details regarding superlattice pillar formation may be found in co-pending U.S. patent application Ser. No. 11/426,969 entitled FINFET INCLUDING A SUPERLATTICE to Mears et al., which is assigned to the current Assignee and is hereby incorporated in its entirety by reference.

In the above-described devices, the inclusion of high mobility, band-engineered semiconductor superlattices 25 adjacent the drain region between the body-to-drain junction and the drain contact region may advantageously provide desired on-resistance reduction, as will be appreciated by those skilled in the art from the following description. The superlattices 25 may extend into the body of the source region in some embodiments, as will also be appreciated by those skilled in the art. The substrate 21 and the band-engineered semiconductor superlattices 25 will preferably have a resistivity that is high enough to withstand the desired device voltage.

Applicants have identified improved materials or structures for semiconductor devices such as MOSFETs, for example. More specifically, the Applicants have identified materials or structures having energy band structures for which the appropriate conductivity effective masses for electrons and/or holes are substantially less than the corresponding values for silicon.

Figure 9:
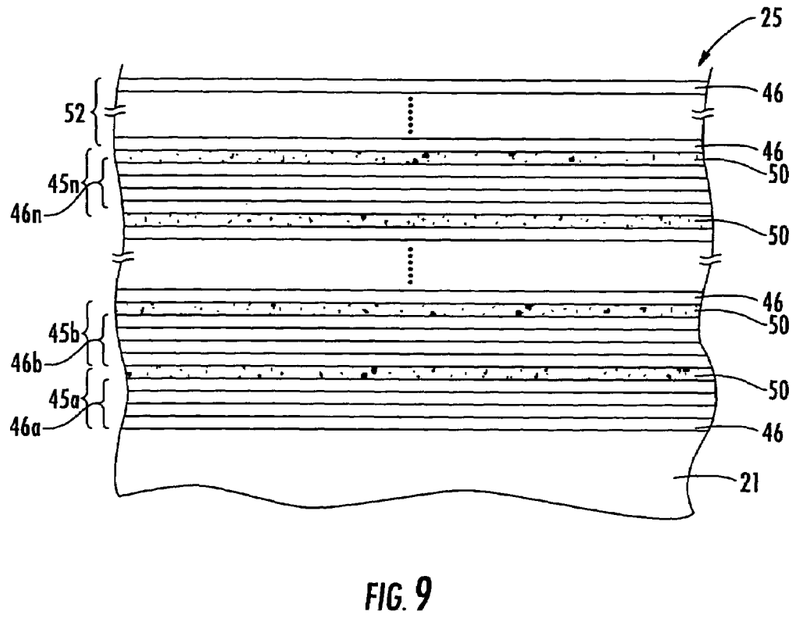
FIG. 9 is a greatly enlarged schematic cross-sectional view of a superlattice for use in a semiconductor device in accordance with the present invention.
Figure 10:
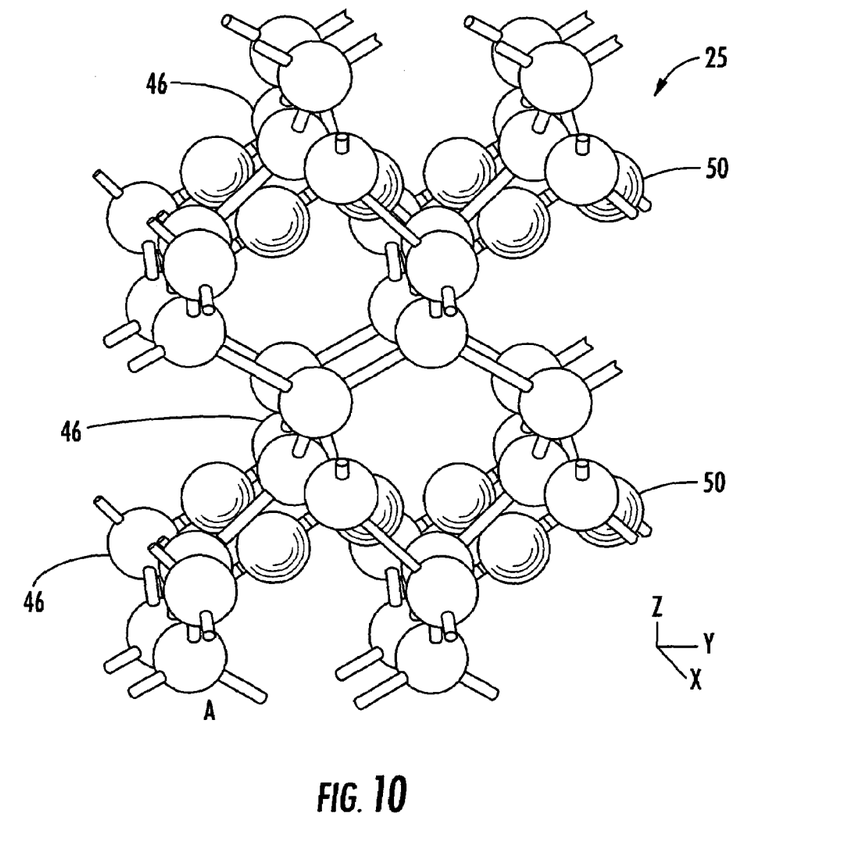
FIG. 10 is a perspective schematic atomic diagram of a portion of the superlattice shown in FIG. 9.

Referring now additionally to FIGS. 9 and 10, the materials or structures are in the form of a superlattice 25 whose structure is controlled at the atomic or molecular level and may be formed using known techniques of atomic or molecular layer deposition. The superlattice 25 includes a plurality of layer groups 45a-45n arranged in stacked relation, as perhaps best understood with specific reference to the schematic cross-sectional view of FIG. 9.

Each group of layers 45a-45n of the superlattice 25 illustratively includes a plurality of stacked base semiconductor monolayers 46 defining a respective base semiconductor portion 46a-46n and an energy band-modifying layer 50 thereon. The energy band-modifying layers 50 are indicated by stippling in FIG. 1 for clarity of illustration.

The energy band-modifying layer 50 illustratively includes one non-semiconductor monolayer constrained within a crystal lattice of adjacent base semiconductor portions. In other embodiments, more than one such monolayer may be possible. It should be noted that reference herein to a non-semiconductor or semiconductor monolayer means that the material used for the monolayer would be a non-semiconductor or semiconductor if formed in bulk. That is, a single monolayer of a material, such as semiconductor, may not necessarily exhibit the same properties that it would if formed in bulk or in a relatively thick layer, as will be appreciated by those skilled in the art.

Applicants theorize without wishing to be bound thereto that energy band-modifying layers 50 and adjacent base semiconductor portions 46a-46n cause the superlattice 25 to have a lower appropriate conductivity effective mass for the charge carriers in the parallel layer direction than would otherwise be present. Considered another way, this parallel direction is orthogonal to the stacking direction. The band-modifying layers 50 may also cause the superlattice 25 to have a common energy band structure. The band modifying layers 50 may also cause the superlattice 25 to have a common energy band structure, while also advantageously functioning as an insulator between layers or regions vertically above and below the superlattice.

Moreover, this structure may also advantageously act as a barrier to dopant and/or material bleed between layers vertically above and below the superlattice 25. These properties may thus advantageously allow the superlattice 25 to provide an interface for high-K dielectrics which not only reduces bleeding of the high-K material into the channel region, but which may also advantageously reduce unwanted scattering effects and improve device mobility, as will be appreciated by those skilled in the art.

It is also theorized that semiconductor devices including the superlattice 25 may enjoy a higher charge carrier mobility based upon the lower conductivity effective mass than would otherwise be present. In some embodiments, and as a result of the band engineering achieved by the present invention, the superlattice 25 may further have a substantially direct energy bandgap that may be particularly advantageous for opto-electronic devices, for example, as described in further detail below.

The superlattice 25 also illustratively includes a cap layer 52 on an upper layer group 45n. The cap layer 52 may comprise a plurality of base semiconductor monolayers 46. The cap layer 52 may have between 2 to 100 monolayers of the base semiconductor, and, more preferably between 10 to 50 monolayers.

Each base semiconductor portion 46a-46n may comprise a base semiconductor selected from the group consisting of Group IV semiconductors, Group III-V semiconductors, and Group II-VI semiconductors. Of course, the term Group IV semiconductors also includes Group IV-IV semiconductors, as will be appreciated by those skilled in the art. More particularly, the base semiconductor may comprise at least one of silicon and germanium, for example.

Each energy band-modifying layer 50 may comprise a non-semiconductor selected from the group consisting of oxygen, nitrogen, fluorine, and carbon-oxygen, for example. The non-semiconductor is also desirably thermally stable through deposition of a next layer to thereby facilitate manufacturing. In other embodiments, the non-semiconductor may be another inorganic or organic element or compound that is compatible with the given semiconductor processing as will be appreciated by those skilled in the art. More particularly, the base semiconductor may comprise at least one of silicon and germanium, for example.

It should be noted that the term monolayer is meant to include a single atomic layer and also a single molecular layer. It is also noted that the energy band-modifying layer 50 provided by a single monolayer is also meant to include a monolayer wherein not all of the possible sites are occupied. For example, with particular reference to the atomic diagram of FIG. 10, a 4/1 repeating structure is illustrated for silicon as the base semiconductor material, and oxygen as the energy band-modifying material. Only half of the possible sites for oxygen are occupied.

In other embodiments and/or with different materials this one half occupation would not necessarily be the case as will be appreciated by those skilled in the art. Indeed it can be seen even in this schematic diagram, that individual atoms of oxygen in a given monolayer are not precisely aligned along a flat plane as will also be appreciated by those of skill in the art of atomic deposition. By way of example, a preferred occupation range is from about one-eighth to one-half of the possible oxygen sites being full, although other numbers may be used in certain embodiments.

Silicon and oxygen are currently widely used in conventional semiconductor processing, and, hence, manufacturers will be readily able to use these materials as described herein. Atomic or monolayer deposition is also now widely used. Accordingly, semiconductor devices incorporating the superlattice 25 in accordance with the invention may be readily adopted and implemented, as will be appreciated by those skilled in the art.

It is theorized without Applicants wishing to be bound thereto, that for a superlattice, such as the Si/O superlattice, for example, that the number of silicon monolayers should desirably be seven or less so that the energy band of the superlattice is common or relatively uniform throughout to achieve the desired advantages. The 4/1 repeating structure shown in FIGS. 9 and 10, for Si/O has been modeled to indicate an enhanced mobility for electrons and holes in the X direction. For example, the calculated conductivity effective mass for electrons (isotropic for bulk silicon) is 0.26 and for the 4/1 SiO superlattice in the X direction it is 0.12 resulting in a ratio of 0.46. Similarly, the calculation for holes yields values of 0.36 for bulk silicon and 0.16 for the 4/1 Si/O superlattice resulting in a ratio of 0.44.

While such a directionally preferential feature may be desired in certain semiconductor devices, other devices may benefit from a more uniform increase in mobility in any direction parallel to the groups of layers. It may also be beneficial to have an increased mobility for both electrons or holes, or just one of these types of charge carriers as will be appreciated by those skilled in the art.

The lower conductivity effective mass for the 4/1 Si/O embodiment of the superlattice 25 may be less than two-thirds the conductivity effective mass than would otherwise occur, and this applies for both electrons and holes. Of course, the superlattice 25 may further comprise at least one type of conductivity dopant therein, as will also be appreciated by those skilled in the art.

Figure 11:
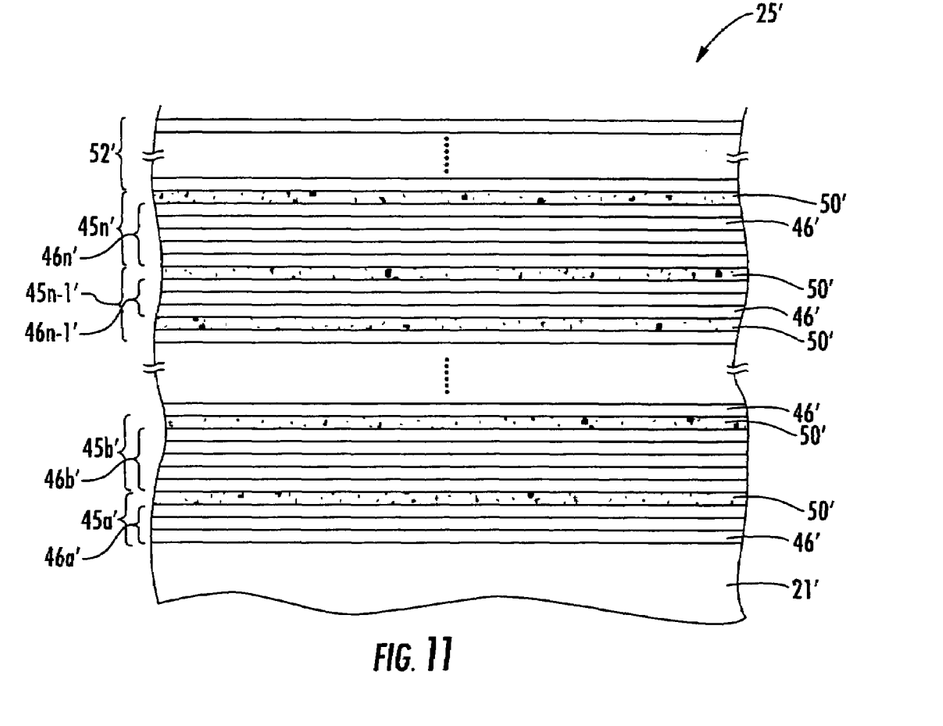
FIG. 11 is a greatly enlarged schematic cross-sectional view of another embodiment of a superlattice that may be used in the device of FIG. 1.

Indeed, referring now additionally to FIG. 11, another embodiment of a superlattice 25' in accordance with the invention having different properties is now described. In this embodiment, a repeating pattern of 3/1/5/1 is illustrated. More particularly, the lowest base semiconductor portion 46a' has three monolayers, and the second lowest base semiconductor portion 46b' has five monolayers. This pattern repeats throughout the superlattice 25'. The energy band-modifying layers 50' may each include a single monolayer. For such a superlattice 25' including Si/O, the enhancement of charge carrier mobility is independent of orientation in the plane of the layers. Those other elements of FIG. 11 not specifically mentioned are similar to those discussed above with reference to FIG. 9 and need no further discussion herein.

In some device embodiments, all of the base semiconductor portions of a superlattice may be a same number of monolayers thick. In other embodiments, at least some of the base semiconductor portions may be a different number of monolayers thick. In still other embodiments, all of the base semiconductor portions may be a different number of monolayers thick.

Figure 12A:
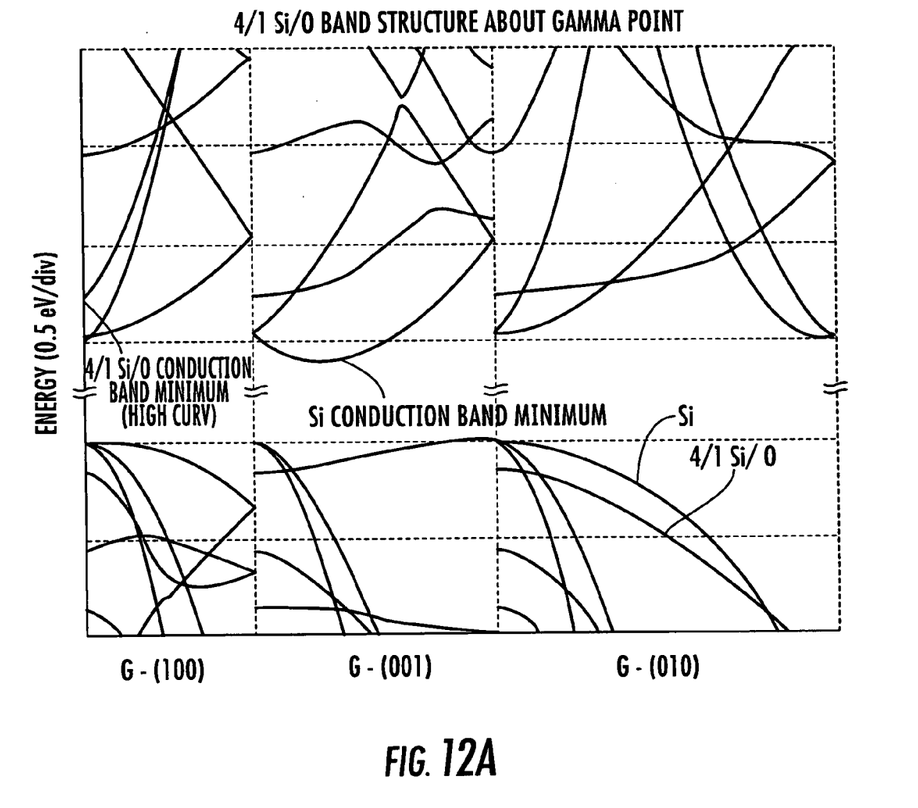
FIG. 12A is a graph of the calculated band structure from the gamma point (G) for both bulk silicon as in the prior art, and for the 4/1 Si/O superlattice as shown in FIGS. 9-10.
Figure 12B:
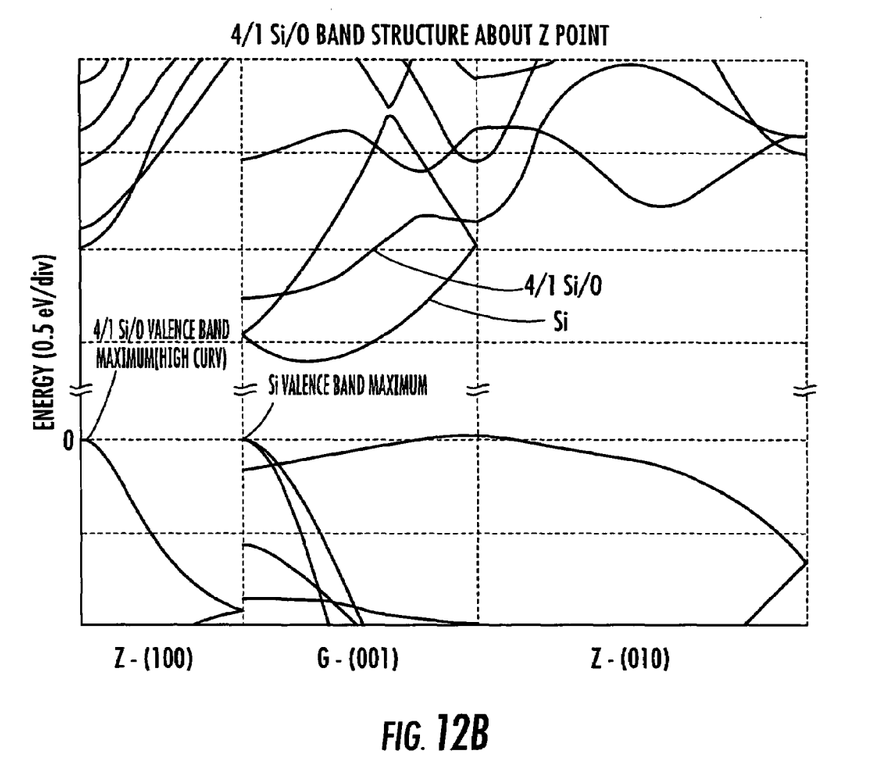
FIG. 12B is a graph of the calculated band structure from the Z point for both bulk silicon as in the prior art, and for the 4/1 Si/O superlattice as shown in FIGS. 9-10.
Figure 12C:
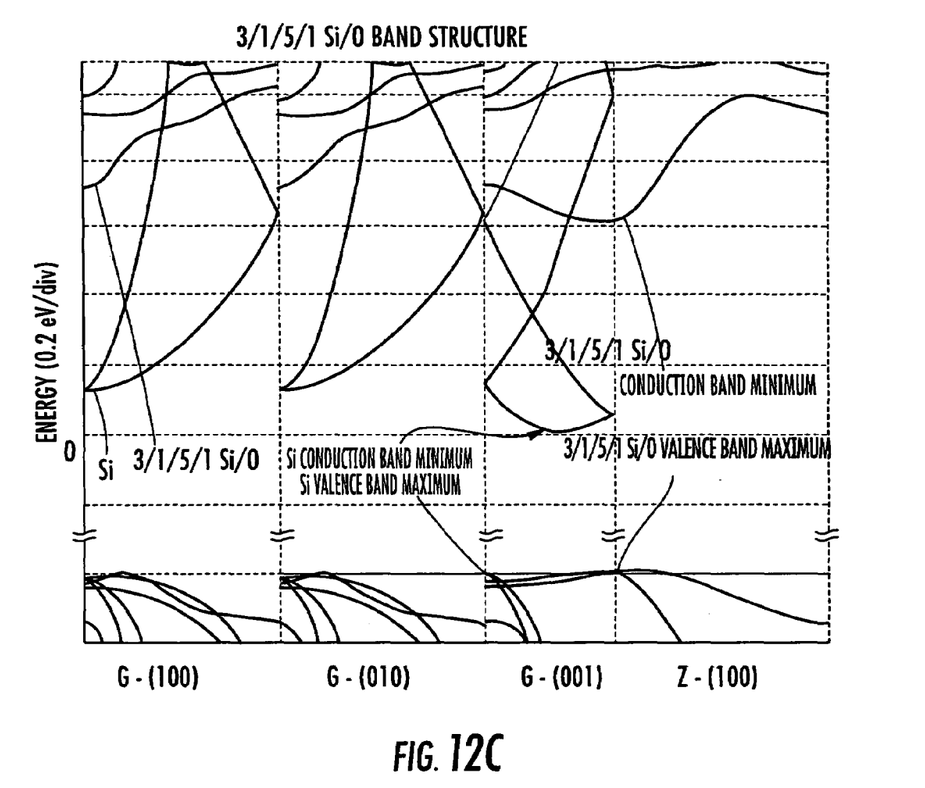
FIG. 12C is a graph of the calculated band structure from both the gamma and Z points for both bulk silicon as in the prior art, and for the 5/1/3/1 Si/O superlattice as shown in FIG. 11.

In FIGS. 12A-12C, band structures calculated using Density Functional Theory (DFT) are presented. It is well known in the art that DFT underestimates the absolute value of the bandgap. Hence all bands above the gap may be shifted by an appropriate "scissors correction." However the shape of the band is known to be much more reliable. The vertical energy axes should be interpreted in this light.

FIG. 12A shows the calculated band structure from the gamma point (G) for both bulk silicon (represented by continuous lines) and for the 4/1 Si/O superlattice 25 shown in FIG. 9 (represented by dotted lines). The directions refer to the unit cell of the 4/1 Si/O structure and not to the conventional unit cell of Si, although the (001) direction in the figure does correspond to the (001) direction of the conventional unit cell of Si, and, hence, shows the expected location of the Si conduction band minimum. The (100) and (010) directions in the figure correspond to the (110) and (−100) directions of the conventional Si unit cell. Those skilled in the art will appreciate that the bands of Si on the figure are folded to represent them on the appropriate reciprocal lattice directions for the 4/1 Si/O structure.

It can be seen that the conduction band minimum for the 4/1 Si/O structure is located at the gamma point in contrast to bulk silicon (Si), whereas the valence band minimum occurs at the edge of the Brillouin zone in the (001) direction which we refer to as the Z point. One may also note the greater curvature of the conduction band minimum for the 4/1 Si/O structure compared to the curvature of the conduction band minimum for Si owing to the band splitting due to the perturbation introduced by the additional oxygen layer.

FIG. 12B shows the calculated band structure from the Z point for both bulk silicon (continuous lines) and for the 4/1 Si/O superlattice 25 (dotted lines) This figure illustrates the enhanced curvature of the valence band in the (100) direction.

FIG. 12C shows the calculated band structure from both the gamma and Z point for both bulk silicon (continuous lines) and for the 5/1/3/1 Si/O structure of the superlattice 25' of FIG. 11 (dotted lines). Due to the symmetry of the 5/1/3/1 Si/O structure, the calculated band structures in the (100) and (010) directions are equivalent. Thus the conductivity effective mass and mobility are expected to be isotropic in the plane parallel to the layers, i.e. perpendicular to the (001) stacking direction. Note that in the 5/1/3/1 Si/O example the conduction band minimum and the valence band maximum are both at or close to the Z point.

Although increased curvature is an indication of reduced effective mass, the appropriate comparison and discrimination may be made via the conductivity reciprocal effective mass tensor calculation. This leads Applicants to further theorize that the 5/1/3/1 superlattice 25' should be substantially direct bandgap. As will be understood by those skilled in the art, the appropriate matrix element for optical transition is another indicator of the distinction between direct and indirect bandgap behavior.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the invention.

That which is claimed is:

1. A method for making a semiconductor device comprising:
   providing a substrate having a plurality of spaced apart superlattices therein; and
   forming source and drain regions in the substrate defining a channel region therebetween and with the plurality of spaced apart superlattices in the drain region;
   each superlattice comprising a plurality of stacked groups of layers with each group comprising a plurality of stacked base semiconductor monolayers defining a base semiconductor portion and at least one non-semiconductor monolayer thereon, and with the at least one non-semiconductor monolayer being constrained within a crystal lattice of adjacent base semiconductor portions;
   wherein at least some semiconductor atoms from opposing base semiconductor portions are chemically bound together with the chemical bonds traversing the at least one non-semiconductor monolayer therebetween.

2. The method of claim 1 wherein forming comprises forming the source and drain regions so that the plurality of spaced apart superlattices also extend into the channel region.

3. The method of claim 1 wherein the source and drain regions are laterally spaced apart.

4. The method of claim 1 wherein the source and drain regions are vertically spaced apart.

5. The method of claim 1 wherein forming comprises forming the source and drain regions so that the spaced apart superlattices extend laterally between the source and drain regions.

6. The method of claim 1 wherein forming comprises forming the source and drain regions so that the spaced apart superlattices extend vertically between the source and drain regions.

7. The method of claim 1 wherein the spaced apart superlattices are substantially parallel to one another.

8. The method of claim 1 further comprising forming a gate dielectric layer adjacent the channel region, and forming a gate electrode layer adjacent the gate dielectric layer.

9. The method of claim 1 wherein the base semiconductor portions comprise silicon, and wherein the at least one non-semiconductor monolayer comprises oxygen.

10. The method of claim 1 wherein each non-semiconductor layer is a single monolayer thick.

11. The method of claim 1 wherein each base semiconductor portion is less than eight monolayers thick.

12. The method of claim 1 wherein each superlattice further comprises a base semiconductor cap layer on an uppermost group of layers.

13. The method of claim 1 wherein all of the base semiconductor portions are the same number of monolayers thick.

14. The method of claim 1 wherein at least some of the base semiconductor portions are a different number of monolayers thick.

15. The method of claim 1 wherein all of the base semiconductor portions are a different number of monolayers thick.

16. The method of claim 1 wherein each base semiconductor portion comprises a base semiconductor selected from the group consisting of Group IV semiconductors, Group III-V semiconductors, and Group II-VI semiconductors.

17. The method of claim 1 wherein each non-semiconductor monolayer comprises a non-semiconductor selected from the group consisting of oxygen, nitrogen, fluorine, and carbon-oxygen.

18. A method for making a semiconductor device comprising:

providing a substrate having a plurality of spaced apart superlattices therein; and forming source and drain regions in the substrate defining a channel region therebetween and with the plurality of spaced apart superlattices in the channel region;

each superlattice comprising a plurality of stacked groups of layers with each group comprising a plurality of stacked base semiconductor monolayers defining a base semiconductor portion and at least one non-semiconductor monolayer thereon, and with the at least one non-semiconductor monolayer being constrained within a crystal lattice of adjacent base semiconductor portions;

wherein at least some semiconductor atoms from opposing base semiconductor portions are chemically bound together with the chemical bonds traversing the at least one non-semiconductor monolayer therebetween.

19. The method of claim 18 wherein the source and drain regions are laterally spaced apart.

20. The method of claim 18 wherein the source and drain regions are vertically spaced apart.

21. The method of claim 18 wherein forming comprises forming the source and drain regions so that the spaced apart superlattices extend laterally between the source and drain regions.

22. The method of claim 18 wherein forming comprises forming the source and drain regions so that the spaced apart superlattices extend vertically between the source and drain regions.

23. The method of claim 18 wherein the spaced apart superlattices are substantially parallel to one another.

24. The method of claim 18 further comprising forming a gate dielectric layer adjacent the channel region, and forming a gate electrode layer adjacent the gate dielectric layer.

25. The method of claim 18 wherein the base semiconductor portions comprise silicon, and wherein the at least one non-semiconductor monolayer comprises oxygen.

* * * * *